US009456505B2

(12) United States Patent
Sakamoto

(10) Patent No.: US 9,456,505 B2
(45) Date of Patent: Sep. 27, 2016

(54) COMPONENT MOUNTING METHOD

(75) Inventor: Masaru Sakamoto, Shizuoka-ken (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 221 days.

(21) Appl. No.: 14/116,256

(22) PCT Filed: Mar. 8, 2012

(86) PCT No.: PCT/JP2012/001615
§ 371 (c)(1),
(2), (4) Date: Nov. 7, 2013

(87) PCT Pub. No.: WO2012/172715
PCT Pub. Date: Dec. 20, 2012

(65) Prior Publication Data
US 2014/0090244 A1    Apr. 3, 2014

(30) Foreign Application Priority Data
Jun. 14, 2011   (JP) .................................. 2011-131841

(51) Int. Cl.
*H05K 3/30* (2006.01)
*H05K 13/04* (2006.01)
(Continued)

(52) U.S. Cl.
CPC ............ *H05K 3/301* (2013.01); *H05K 3/0008* (2013.01); *H05K 13/0452* (2013.01); *H05K 13/08* (2013.01); *Y10T 29/4913* (2015.01); *Y10T 29/49778* (2015.01)

(58) Field of Classification Search
CPC ...... H05K 13/00; H05K 13/04; H05K 13/05; H05K 13/09; H05K 3/0008; H05K 3/301; H05K 13/0452; H05K 13/08; Y10T 29/49778
See application file for complete search history.

(56) References Cited

U.S. PATENT DOCUMENTS 4,725,182 A * 2/1988 Sakamoto .......... H05K 13/0061
198/465.1
4,862,587 A * 9/1989 Nakata ................. H01R 43/048
29/564.4
(Continued)

FOREIGN PATENT DOCUMENTS

CN        1922560 A      2/2007
CN       101854795 A    10/2010
(Continued)

OTHER PUBLICATIONS

International Search Report; PCT/JP2012/001615; Apr. 10, 2012.
(Continued)

*Primary Examiner* — Carl Arbes
(74) *Attorney, Agent, or Firm* — Studebaker & Brackett PC

(57) ABSTRACT

The present invention relates to a setup method for deciding component feeding apparatuses to be attached to each of mounting machines in a component mounting system. The setup method includes a first step of deciding component feeding apparatuses to be attached to each of the mounting machines based on substrate data defining components to be mounted by each of the mounting machines; a second step of determining whether or not there is within the components included in the substrate data a sole mounted component to be mounted by only one mounting machine among the multiple mounting machines; and a third step of deciding, when the determination is made that the sole mounted component exists, to attach component feeding apparatuses feeding the sole mounted component or an alternative component capable of replacing the sole mounted component onto at least one mounting machine other than the only one mounting machine.

7 Claims, 8 Drawing Sheets

(51) Int. Cl.
*H05K 13/08* (2006.01)
*H05K 3/00* (2006.01)

(56) References Cited

U.S. PATENT DOCUMENTS

| | | | | |
|---|---|---|---|---|
| 5,765,278 | A * | 6/1998 | Koike | H01R 43/055 29/33 M |
| 6,944,943 | B2 * | 9/2005 | Cho | H05K 13/046 198/468.01 |
| 6,961,992 | B2 * | 11/2005 | Conte | H01R 43/048 29/33 M |
| 7,036,213 | B2 * | 5/2006 | Kabeshita | H05K 13/0061 29/740 |
| 7,603,768 | B2 * | 10/2009 | Viviroli | H01R 43/0488 29/33 M |
| 2001/0037187 | A1 | 11/2001 | Kawahara | |
| 2002/0062554 | A1 * | 5/2002 | Hwang | H05K 13/0061 29/832 |
| 2002/0062555 | A1 * | 5/2002 | Hwang | H05K 13/0061 29/832 |
| 2008/0217394 | A1 | 9/2008 | Okada et al. | |
| 2008/0221723 | A1 * | 9/2008 | Lee | H05K 13/0061 700/112 |
| 2008/0228304 | A1 | 9/2008 | Maenishi et al. | |

FOREIGN PATENT DOCUMENTS

| | | |
|---|---|---|
| JP | 08-137828 A | 5/1996 |
| JP | 09-260900 A | 10/1997 |
| JP | 10-209681 A | 8/1998 |
| JP | 2000-244187 A | 9/2000 |
| JP | 2001-267799 A | 9/2001 |
| JP | 2009-123902 A | 6/2009 |
| WO | 00/18208 A1 | 3/2000 |

OTHER PUBLICATIONS

The extended European search report issued by the European Patent Office on Mar. 1, 2016, which corresponds to European Patent Application No. 12799980.3-1905 and is related to U.S. Appl. No. 14/116,256.

* cited by examiner

FIG. 5A STANDARD SUBSTRATE DATA

FIG. 5B ALTERNATIVE SUBSTRATE DATA

COMPONENT MOUNTING METHOD

TECHNICAL FIELD

The present invention relates to a component mounting system in which multiple mounting machines are arranged in parallel along a transport path of a substrate, and particularly to the technique in order to appropriately arrange component feeding means to each of the mounting machines.

BACKGROUND ART

Component mounting systems have been known in which multiple mounting machines are arranged in parallel along a transport path of substrates. In such component mounting systems, each mounting machine mounts electronic components such as integrated circuits (ICs) onto substrates while they are transported along the transport path. In such component mounting systems, shortage of components or malfunction (hereinafter collectively referred to as simply "trouble") which occur in one of the multiple mounting machines and cause an extension of cycle time of the mounting machine may be a bottleneck to reduce an overall throughput of the system.

In order to eliminate such disadvantages, a component mounting system is proposed in, for example, Patent Document 1. In this component mounting system, when a cycle time of a particular mounting machine becomes longer than that of other mounting machines, it is examined whether a component otherwise mounted by this particular mounting machine or an alternative component which can replace the component in question (i.e., a component of the same type as the component in question) can be mounted by another mounting machine(s) (i.e., it is examined whether the component in question is used by another mounting machine) and if it is possible, the component otherwise mounted by the particular mounting machine is alternatively mounted by another mounting machine(s).

However, in such a component mounting system, when the component otherwise mounted by the particular mounting machine (or alternative component) cannot be mounted by another mounting machine, namely when the component in question (or alternative component) is not used in another mounting machine, alternative mounting is not possible, thereby providing no contribution in improvement in a throughput of the system in some cases. Recently, for example, in order to equalize mounting times among mounting machines and improve the process efficiency, optimization of line balance has been sought with using calculation procedures disclosed in Patent Documents 2 and 3. However, in those cases, there may be more components which can be mounted by only one mounting machine among multiple mounting machines (such a component which is mounted on a substrate by only one mounting machine is referred to as "sole mounted component" herein), and therefore the number of the cases may be relatively increased in which the alternative mounting as described in Patent Document 1 may not be feasible.

Patent Document 1: Japanese Patent Application Laid-open No. 2001-267799 (FIG. 7)
Patent Document 2: Japanese Patent Application Laid-open No. H10-209681
Patent Document 3: Japanese Patent Application Laid-open No. H8-137828

SUMMARY OF THE INVENTION

With the foregoing in view, it is an object of the present invention to provide the technique which can contribute to improvement in a throughput of component mounting systems comprising multiple mounting machines arranged along a transport path of substrates.

The present invention which achieves the above objective is a setup method for deciding component feeding means to be attached to each mounting machine arranged along a transport direction of a substrate in a component mounting system, this method comprising: a first step of deciding a component feeding means to be attached to each of the mounting machines based on substrate data preliminarily defining components to be mounted by each of the mounting machines; a second step of determining whether or not there is within the components included in the substrate data a sole mounted component mounted by only one mounting machine among the multiple mounting machines; and a third step of deciding, when the decision has been made that the sole mounted component exists in the second step, to attach component feeding means for feeding the sole mounted component or an alternative component capable of replacing the sole mounted component onto at least one mounting machine other than the only one mounting machine.

According to this setup method, at least one mounting machine other than the only one mounting machine is always attached with the component feeding means containing the sole mounted component or an alternative component capable of replacing the sole mounted component. Therefore, even when shortage of the sole mounted components or malfunction occurs in the only one mounting machine, the sole mounted component can be always alternatively mounted by another mounting machine(s), thereby preventing reduction in the overall throughput of the system.

BEST MODE FOR CARRYING OUT THE INVENTION

Figure 1:
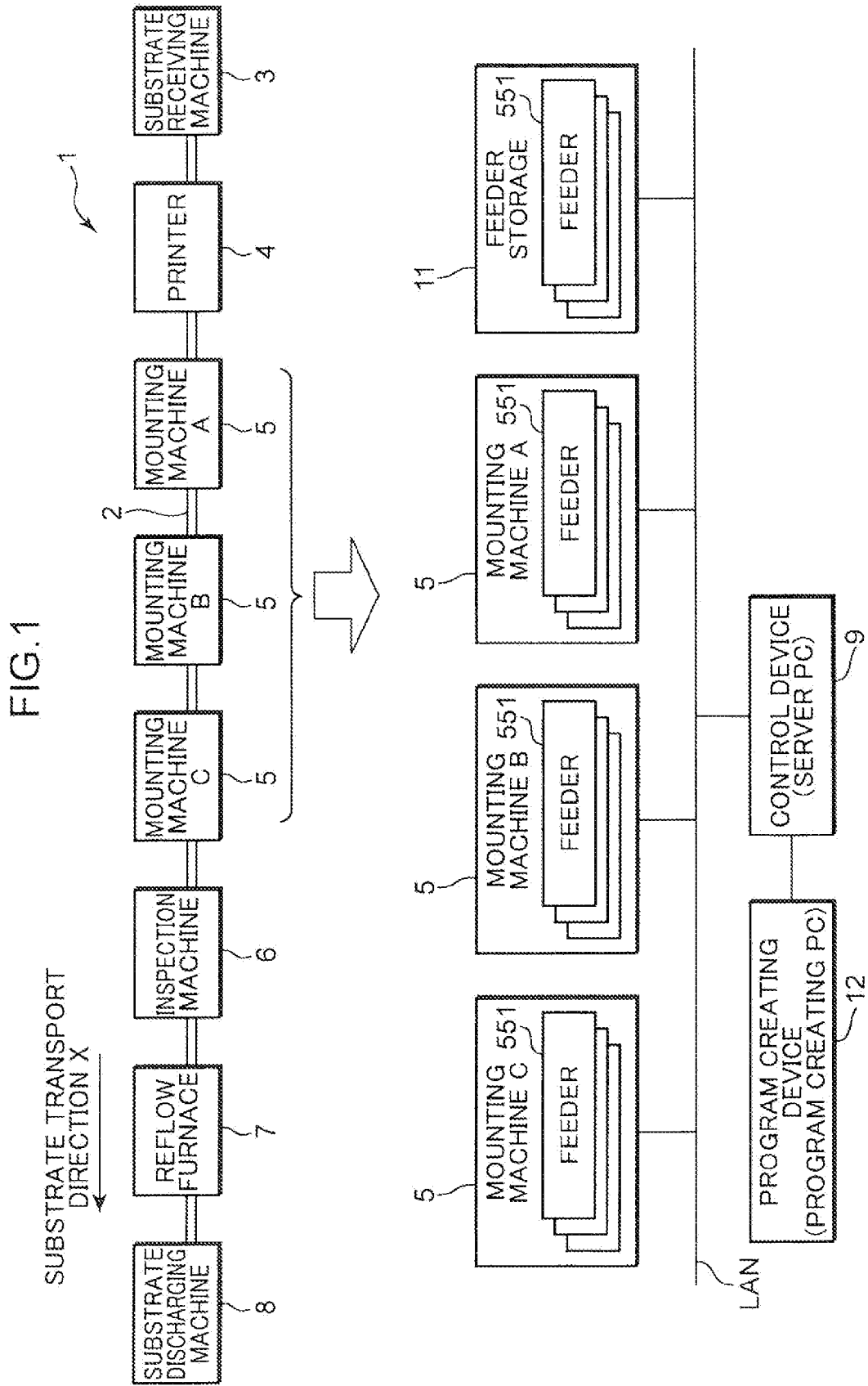
FIG. 1 is a diagram showing a schematic configuration of a component mounting system to which an embodiment of the setup method according to the present invention is applied.

FIG. 1 is a diagram showing a schematic configuration of a component mounting system to which one embodiment of the setup method according to the present invention is applied. The component mounting system 1 comprises, as can be seem from this figure, from upstream (right hand side of the figure) to downstream (left hand side of the figure) along the substrate transport direction X along a transport path 2 which transports substrates, a substrate receiving machine 3, a printer 4, multiple mounting machines 5, an inspection machine 6, a reflow furnace 7, a substrate discharging machine 8 and the like in parallel. Among these, the substrate receiving machine 3 contains substrate holding members which hold many unprocessed substrates and sequentially transfers substrates from these substrate holding members to the printer 4. The printer 4 applies solder cream to an area to be processed on the transferred substrates by printing.

The multiple mounting machines 5 are arranged in line along the transport path 2 in order to sequentially mount components according to a substrate data described hereinbelow onto the substrates to which solder has been applied. In this embodiment, three mounting machines 5 are arranged in parallel. In order to distinguish these three mounting machines, the mounting machine 5 located at the most upstream, the mounting machine 5 located in the middle and the mounting machine 5 located at the most downstream along the substrate transport direction X are respectively referred to as "mounting machine A", "mounting machine B" and "mounting machine C" hereinbelow. However, when they are not distinguished, they are collectively referred to as "mounting machines 5". The substrate data and the configurations of the respective mounting machines 5 are described in detail by referring to the figures hereinbelow.

The substrates mounted with the components by three mounting machines 5 are transported to the inspection machine 6, which inspects the status of mounting of the electronic components on the substrates. A substrate which is determined to have fair quality by the inspection machine 6 is transported to the reflow furnace 7 which then reflows solder cream and connects the substrate and components with solder. The substrates discharged from the reflow furnace 7 are sequentially received into holding members of the substrate discharging machine 8.

The respective elements of the system thus configured (substrate receiving machine 3, printer 4, multiple mounting machines 5, inspection machine 6, reflow furnace 7 and substrate discharging machine 8) are connected to a local area network (hereinafter referred to as LAN). The LAN is connected to a control device (server PC) 9 which controls the overall mounting system. The control device 9 and the respective elements of the system receive and transmit various data therebetween via the LAN. At a distal position from the component mounting system 1, a feeder storage 11 is provided which contains many tape feeders prepared so as to be mounted on the respective mounting machines 5 and is connected to the control device 9 via the LAN as shown in the lower panel of FIG. 1.

The number "12" in FIG. 1 represents a program creating device (program creating PC) which creates programs to be run at the respective elements in the device and provides the programs to controllers (not shown) in the respective elements of the device via the control device 9. Among these, the program which controls the mounting machines 5 contains the data about the type of components to be mounted and the mounting coordinate positions on the substrates as well as the data about the arrangement or positions of the component feeding means on the mounting machines 5 which feed the components to be mounted. These data are collectively referred to as "substrate data". The program creating device 12 creates "standard substrate data (corresponding to the substrate data of the present invention)" which can be determined by known optimization technique as described hereinbelow as well as optionally creates "alternative substrate data (corresponding to alternative data of the present invention)" which is suitable for alternative mounting of the sole mounted component and executes the setup process according thereto. The setup process (FIG. 4), standard substrate data and alternative substrate data (FIG. 5) are described hereinbelow.

Figure 2:
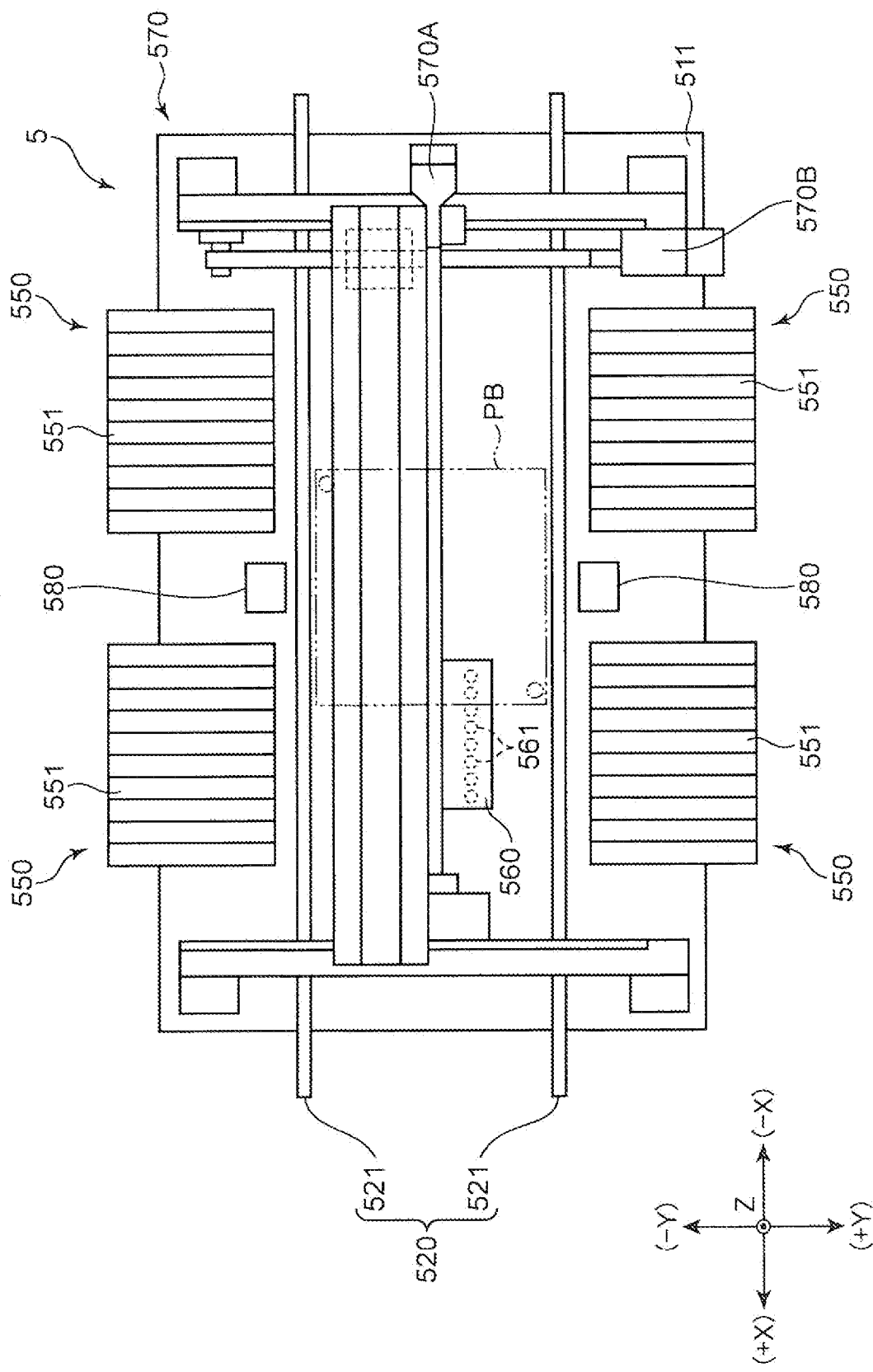
FIG. 2 is a plan view showing a schematic configuration of a mounting machine contained in the component mounting system of FIG. 1.

FIG. 2 a plan view showing a schematic configuration of a mounting machine contained in the component mounting system of FIG. 1. The mounting machine 5 comprises a base 511 and a substrate transport mechanism 520 provided on the base 511 and can transport a substrate PB along the substrate transport direction X. More specifically, the substrate transport mechanism 520 comprises a pair of conveyors 521 which transports the substrate PB on the base 511 from the right hand side to the left hand side of FIG. 2. These conveyors 521 are controlled by a mounting machine controller (not shown) which controls the overall mounting machine 5 and transport the substrate PB along the transport path formed by the conveyors 521. Namely, the conveyors 521 are actuated according to a drive command from the mounting machine controller and stop the substrate PB which has been transported at a predetermined mounting position (the position of the substrate PB shown in FIG. 2). The substrate PB is fixed and retained with a retention apparatus which is omitted from the figure. Electronic components (not shown) are transferred onto the substrate PB from a component holding member 550 by multiple suction nozzles 561 on a head unit 560. After the whole mounting process for all components to be mounted on the substrate PB is completed by repetitive movements of the head unit 560 over the component holding member 550 and the substrate PB, the substrate transport mechanism 520 discharges the substrate PB according to a drive command from the mounting machine controller.

The above component holding member 550 is provided on both sides of the substrate transport mechanism 520 and is detachably provided with one or more tape feeders 551 (corresponding to the component feeding means of the present invention). Each tape feeder 551 contains a reel (not shown) comprising a wound tape containing electronic components at a constant pitch. The electronic components can be fed by reeling out the tape from the reel. In this embodiment, four component holding members 550 in total are provided on upstream and downstream sides each at front (+Y) and rear (−Y) relative to the conveyors 521. The respective component holding members 550 are provided with suitable feeders 551 according to the setup process described hereinbelow. This is also described hereinbelow.

The mounting machine 5 comprises, other than the substrate transport mechanism 520, a head driving mechanism 570. The head driving mechanism 570 is for moving the head unit 560 within a predetermined range on the base 511 and moves the head unit 560 in the X-axis and Y-axis directions (the direction perpendicular to the X-axis and the Z-axis direction) driven by an X-axis motor 570A and a Y-axis motor 570B. By means of the movement of the head unit 560, electronic components suctioned on the suction nozzles 561 are transported from the position above component holding members 550 to the position above the substrate PB. Namely, the head unit 560 comprises eight mounting heads (not shown) running along the vertical direction Z which are provided in the X-axis direction (the transport direction of the substrate PB by the substrate transport mechanism 520) at regular intervals in a line. Each mounting head comprises the suction nozzle 561 at the tip. The head driving mechanism 570 moves the head unit 560 above the component holding members 550, and the suction nozzle 561 is positioned over a component suction position of a feeder 551 which contains the component to be suctioned, descends to suction and hold the electronic component provided by the component holding member 550 by means of the contact between the tip of the suction nozzle 561 and the component and the suction nozzle 561 then ascends. The head unit 560 is transported to above the substrate PB while suction-holding the electronic component by the suction nozzle 561 and transfers the electronic component on the substrate PB at a predetermined position toward a predetermined direction. During transportation, the head unit 560 passes above a camera 580 which is arranged in the middle of the X-axis direction between two component holding members 550 lateral to the transport path and the camera 580 takes images of the electronic components suctioned by the suction nozzles 561 from underneath. Accordingly, any suction shifts at the respective suction nozzles 561 can be detected and the positions are corrected in conformity with the suction shifts when the electronic components are transferred onto the substrate PB.

The setup process and mounting operation in the component mounting system 1 are now described by referring to FIGS. 3 to 7.

Figure 3:
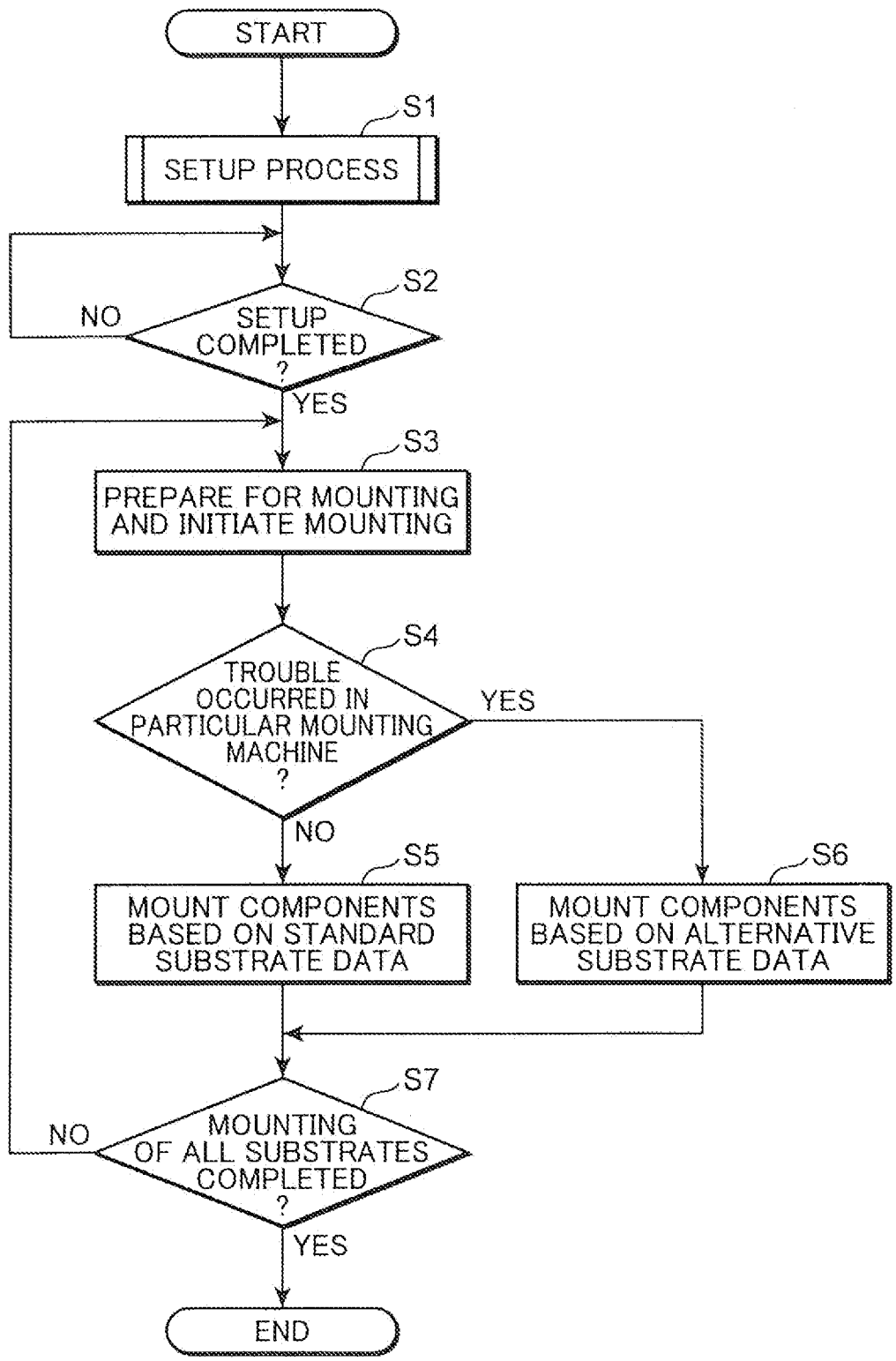
FIG. 3 is a flow chart showing partial operation of the component mounting system of FIG. 1.
Figure 4:
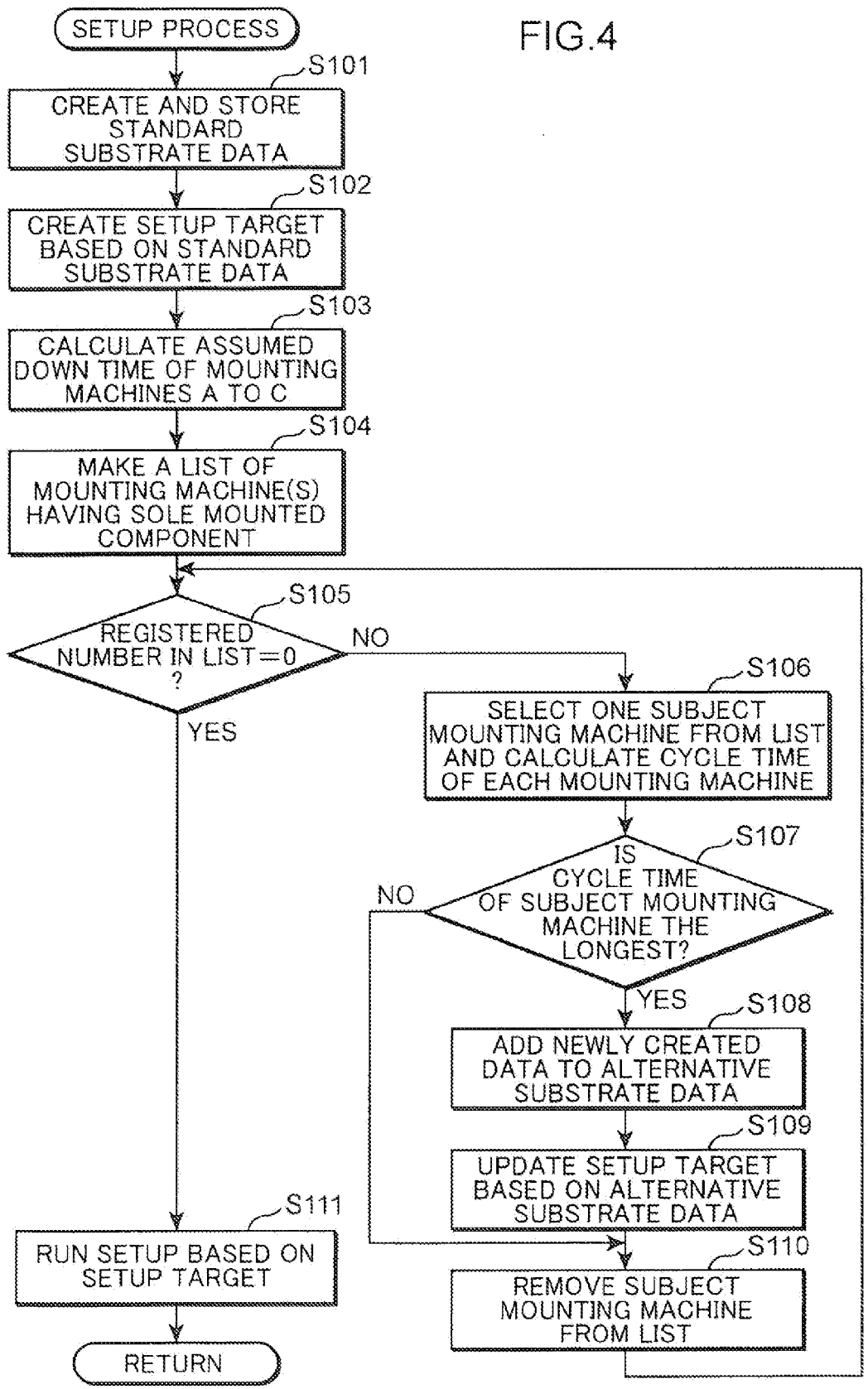
FIG. 4 is a flow chart showing the setup process in FIG. 3.

FIG. 3 is a flow chart showing partial operation of the component mounting system shown in FIG. 1 and FIG. 4 is a flow chart showing the setup process in FIG. 3. As shown in FIG. 3, in this component mounting system 1, the program creating device 12 performs the setup process (step S1) before mounting components on the substrate PB. In this setup process, as shown in FIG. 4, the standard substrate data is created and when there is a sole mounted component, the alternative substrate data is also created. A setup target is created corresponding to the substrate data based on the standard and alternative substrate data and then the substantial setup based on the setup target is displayed on a display (not shown) such as a liquid crystal display in order to allow a user to perform the setup.

The reason for creating the standard substrate data is as follows: when electronic components are mounted by multiple mounting machines 5, the mounting operation of the components to each substrate PB to be produced can be divided among multiple mounting machines 5 and the process time required for mounting the components by each mounting machine 5 can be equalized, thereby allowing effective production of the substrates PB. In the present embodiment, during the setup process shown in FIG. 4, the standard substrate data which represents which mounting operation is assigned to a mounting machine 5 (i.e., which component is mounted on the substrate PB by which mounting machine 5) is prepared by, for example, using the calculation procedures described in Patent Documents 2 and 3, in the Background Art and a memory (not shown) in the program creating device 12 stores the standard substrate data (step S101). The standard substrate data contains, for example as shown in FIG. 5A, the numbers representing the mounting order of the components ("NO"), coordinate information for mounting the component having each number onto the substrate PB ("X coordinate" and "Y coordinate"), information on necessity of mounting as to whether a component is mounted or not at each number ("execution/skip"), information on a mounting head in the mounting head unit 560 to be used for mounting of a component having each number ("head number") (which can be replaced by a nozzle number corresponding to information representing a suction nozzle 561 to be used for mounting of a component having each number), information on the type of a component having each number ("component ID") and the like. The standard substrate data is created for each of the mounting machines A to C in a form of list. The alternative substrate data described hereinbelow also contains identical information.

Following the step S101, a setup target is created which corresponds to feeders 551 to be attached on each mounting machine 5 based on the standard substrate data (the setup target based on the standard substrate data is hereinafter referred to as "standard setup target") (step S102). When the standard setup target is created based on the standard substrate data shown in FIG. 5A, for example, the component having the component ID "5" is mounted only by the mounting machine B, i.e., this is the sole mounted component. Then a feeder 551a containing and retaining this component and a feeder 551b containing and retaining an alternative component for this component are, as shown in FIG. 6A, attached onto the mounting machine B. The feeders 551 which are attached based on the standard substrate data correspond to the "standard component feeding means" of the present invention.

In this case, the alternative mounting of this component cannot be performed smoothly by other mounting machines A and C in case the mounting machine B has troubles because the feeder 551a containing and retaining the sole mounted component or the feeder 551b containing and retaining the alternative component for this component is not attached to other mounting machines A and C. Thus, in the present embodiment, assumed down times of the mounting machines A to C are calculated and the necessity of the alternative substrate data and the setup target are updated based on cycle times (corresponding to the predicted operation time of the present invention) of the mounting machines A to C including the assumed down times (steps S103 to S110).

In the step S103, the assumed down time y of each of the mounting machines A to C is calculated according to the following equation.

$$\text{Assumed down time } y = k\{1-(1-F1)\cdot(1-F2)\ldots(1-Fn)\cdot(1-H1)(1-H2)\ldots(1-Hm)\} \quad [E\ 1]$$

In the above equation, F1, F2, . . . Fn respectively represent the failure rate of n feeders 551 attached to the mounting machine 5 and the failure rate of a feeder 551 is zero when it is not in use. H1, H2, . . . Hm respectively represents the failure rate of m mounting heads (suction nozzles 561) attached to the mounting machine 5 and the failure rate of a mounting head (suction nozzle 561) is zero when it is not in used. The symbol "k" is an adjustment parameter for converting the proportion of failure to time and can be calculated from, for example, the past history by the least square method. By using the above equation as shown in [E 1], the assumed down time per substrate PB can be calculated with relatively high accuracy based on the time in which the mounting machines A to C are assumed to be stopped during component mounting onto the substrate PB in the component mounting system 1.

In the next step S104, the sole mounted component is extracted based on the standard substrate data and a list is made including a mounting machine having the sole mounted component. For example, in case of the standard substrate data shown in FIG. 5A, the component having the component ID "5" is mounted onto the substrate PB only by the mounting machine B and therefore the mounting machine B is added to a list. In a case where there is a mounting machine(s) 5 other than the mounting machine B which has the sole mounted component, such a mounting machine is also added to the list. On the other hand, when there is no sole mounted component, the registered number in the list is zero.

After completion of the listing process, the registered number in the list is examined whether it is zero or not in the step S105. When it is not zero, i.e., there is a mounting machine which has the sole mounted component, creation and update of alternative substrate data and update of setup target are investigated for each of the mounting machine (steps S106 to S110). Namely, one mounting machine is selected as a subject mounting machine among the list and the cycle times of the mounting machines A to C are calculated (step S106). As shown in FIG. 6A, for example, the cycle times of the mounting machines A to C can be equalized by creation of the standard substrate data, thereby allowing rational component mounting in the component mounting system 1; however, even when the setup process and the component mounting are carried out based on such a standard substrate data, a failure may occur in a feeder 551 or a head unit 560 in any of the mounting machines A to C to cause stoppage of the system for maintenance. In order to address this, when the assumed down time per substrate PB of each of the mounting machines A to C calculated in the step S103 is taken into consideration, the cycle time of each of the mounting machines A to C may be altered as shown in FIG. 6B, resulting in a longer cycle time for the mounting machine B than that of other mounting machines A and C. In such case, other mounting machine A or C may have a margin in order to coordinate with the cycle time of the mounting machine B, thereby reducing the overall throughput of the component mounting system 1.

Therefore, in the present embodiment, it is decided whether or not the cycle time of the subject mounting machine is the longest in the step S107. When the decision is "NO" in the step S107, the process proceeds to the step S110 without steps S108 and S109. On the other hand, when the decision is "YES" in the step S107, an alternative substrate data is newly created when there is none or the existing alternative substrate data is updated (step S108). As shown in FIG. 5A, for example, according to the standard substrate data, the component having the component ID "5" which is the sole mounted component is scheduled to be mounted by the mounting machine B, and an alternative substrate data is created by re-wiring (changing) a part of the standard substrate data as follows, as shown in FIG. 5B.

Addition of mounting operation of the order number "9" for the mounting machine A Substantial mounting operation of the order number "9": execution of mounting operation of the order number "1" scheduled to be performed in the mounting machine B Changes in mounting operations of the order numbers "1" and "5" for the mounting machine B Substantial mounting operation of the order number "1": change from execution to skip Substantial mounting operation of the order number "5": change from execution to skip Addition of mounting operation of the order number "9" for the mounting machine C Substantial mounting operation of the order number "9": execution of mounting operation of the order number "5" scheduled to be performed in the mounting machine B When the alternative substrate data exists already, a part of the alternative substrate data is changed.

Based on the thus created or updated alternative substrate data, the setup target is updated (step S109). As described above, when mounting operation of the component scheduled to be performed in the mounting machine B according to the standard substrate data is distributed to the mounting machines A and C based on the alternative substrate data, the feeders 551b containing and retaining the alternative components for the sole mounted component contained and retained in the feeder 551a are distributed from the mounting machine B to the mounting machines A and C. Accordingly, the component contained and retained in the feeder 551a can be mounted by the mounting machine B and even when any trouble is caused in the mounting machine B, mounting of the component can be replaced by using the components contained and retained in the feeders 551b by the mounting machines A and C. The feeders 551 (551b) which are distributed based on the alternative substrate data correspond to the "alternative component feeding means" and the mounting machines 5 (in this case, the mounting machines A and C) to which the feeders 551 (551b) are distributed correspond to the "alternative mounting machine" according to the present invention. In this specific example, the mounting machine to which the feeder 551b is distributed is not focused on one of the mounting machines (A or C). Therefore, as shown in FIG. 6C, the cycle times of the mounting machines A and C which may mount the alternative components are equalized, thereby effectively preventing reduction in the overall throughput of the component mounting system 1.

In the step S110, the subject mounting machine is deleted from the list. The process then returns to the step S105, and when the registered number in the list is not zero, i.e., when the above series of the processes has not been performed for all of the mounting machines having the sole mounted components, the process proceeds to the step S106 in order to create or update an alternative substrate data and update the setup target. As shown in FIG. 7A, for example, according to the standard substrate data, in a case where there are a feeder 551c containing and retaining the sole mounted component mounted only by the mounting machine A and a feeder 551d containing and retaining an alternative component for the sole mounted component, and the cycle time of the mounting machine A is the longest when considering the assumed down time per substrate PB, an alternative substrate data is created, and the feeders 551d are distributed to the mounting machines B and C in order to equalize the cycle times among these, as shown in FIG. 7B. In this case, the feeder 551c which is distributed based on the alternative substrate data corresponds to the "alternative component feeding means" and the mounting machines B and C correspond to the "alternative mounting machine" of the present invention.

When the registered number in the list is zero (the decision is "YES" in the step S105), the process proceeds to the step S111, and the setup target is displayed on the display in order to allow a user or an operator to perform the setup based on the setup target. Because the setup action is previously known, the detailed description for the setup action is omitted herein.

According to FIG. 3, when the setup is completed (the decision is "YES" in the step S2), the preparation for mounting is completed and the mounting operation is initiated based on the standard substrate data (step S3). In the mounting operation, while the substrate PB onto which solder has been printed is transported among the mounting machines A, B and C in this order, the components are mounted based on the standard substrate data. During the mounting of the components, trouble may be detected in the mounting machines 5. In the present embodiment, it is decided whether or not the mounting machine having the trouble corresponds to a particular mounting machine which mounts the sole mounted component (when the components are mounted according to the standard substrate data shown in FIG. 5A, the mounting machine B corresponds to the particular mounting machine, which corresponds to the "only one mounting machine" of the present invention) (step S4) and the components are mounted according to the result of the decision. Namely, when no trouble has occurred or when trouble has occurred but the mounting machine 5 having the trouble is not the particular mounting machine 5, the components are mounted according to the standard substrate data (step S5).

On the other hand, when the particular mounting machine 5 has trouble, the components are mounted according to the alternative substrate data (step S6). For example, when the components are mounted according to the standard substrate data shown in FIG. 5A and the mounting machine B has trouble, mounting of the components is switched to the one based on the alternative substrate data shown in FIG. 5B. The component having the component ID "5" which is the sole mounted component based on the standard substrate data is mounted on the substrate PB by the mounting machines A and C.

The switching of the substrate data is continuously carried out until the completion of mounting of the components on all substrates PB which is decided in the step S7.

The actions in the component mounting system are described by referring to FIG. 3 and the setup processes during these actions are described by referring to FIG. 4 hereinabove. Among these actions and processes, the steps S101 and S102, the steps S104 and S105, the steps S107, S108 and S109 and the step S106 in FIG. 4 respectively correspond to "the first step", "the second step", "the third step" and "the fourth step" of the present invention. The steps S1 and S2 and the steps S3 to S6 in FIG. 4 respectively correspond to the "setup step" and the "component mounting step" of the present invention. The steps S104 to S109 in FIG. 3 correspond to the "alternative data creation step" of the present invention.

Figure 5:
FIG. 5 is a diagram showing an example of a standard substrate data and an alternative substrate data.
Figure 6:
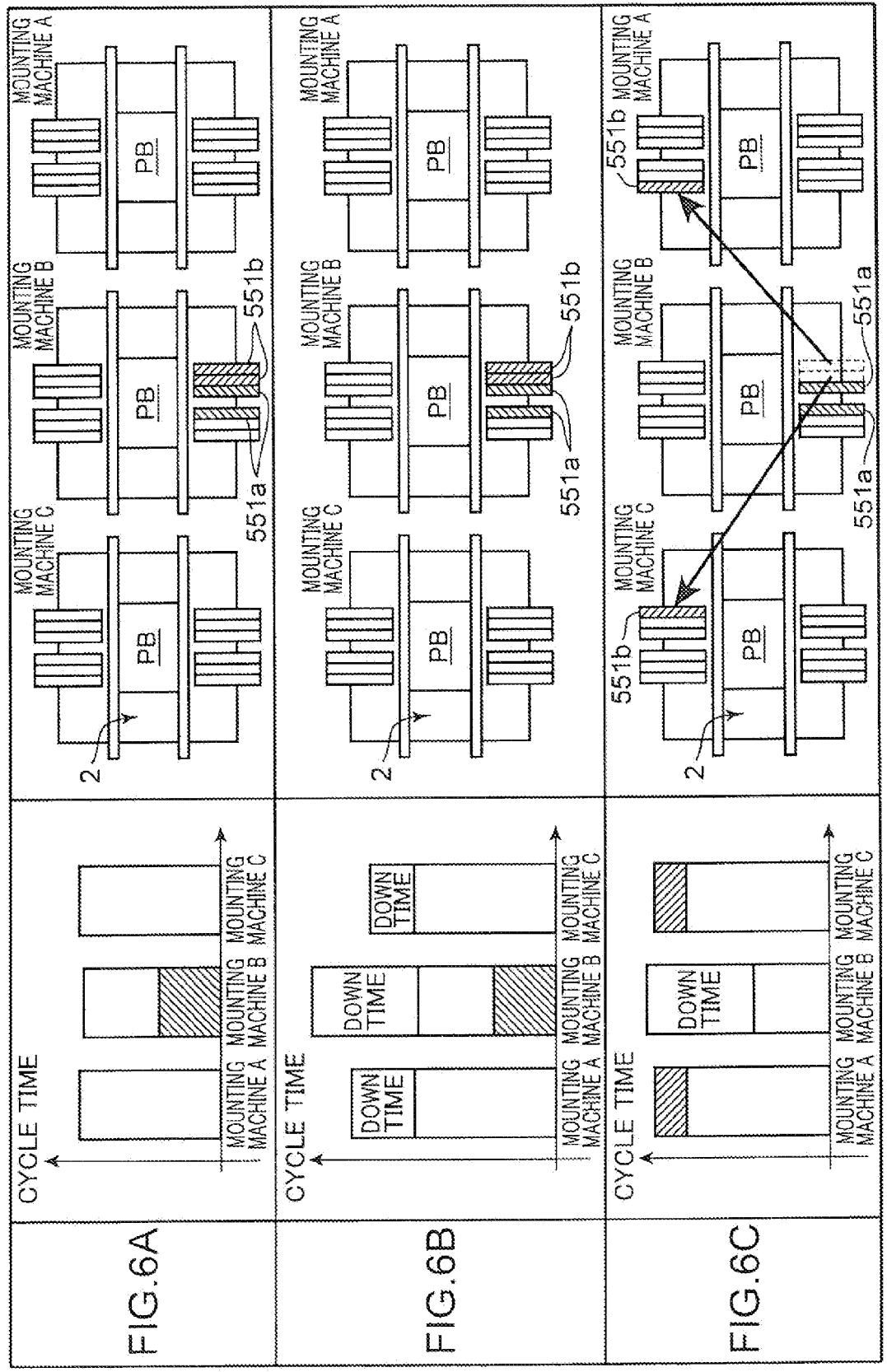
FIG. 6 is a schematic diagram showing an embodiment of the setup method according to the present invention.
Figure 7:
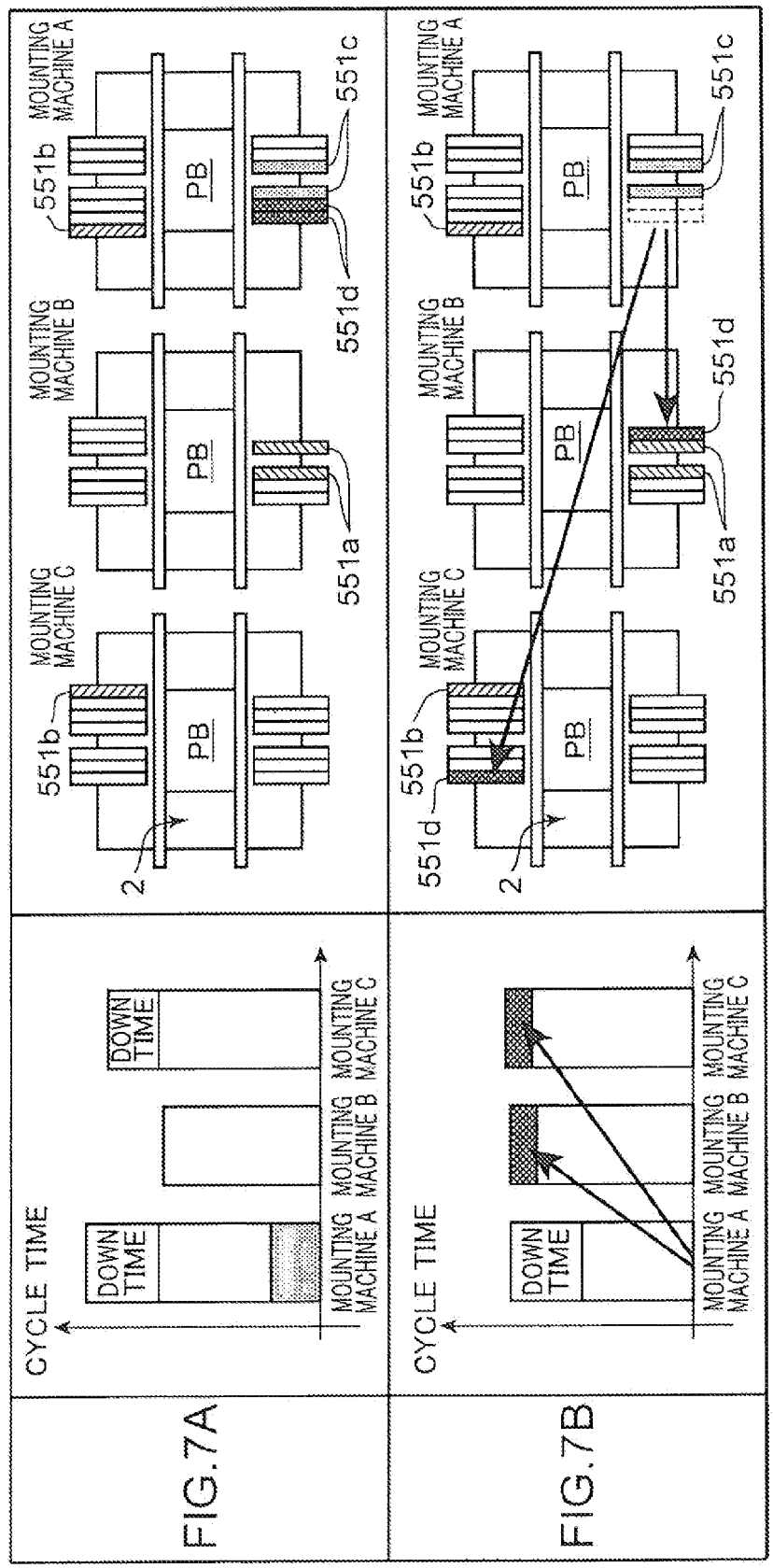
FIG. 7 is a schematic diagram showing an embodiment of the setup method according to the present invention.

As described above, in the component mounting system 1 of the present embodiment, the cycle times of the mounting machines A to C are equalized due to the standard substrate data, thereby allowing rational mounting of the components. In addition, as the setup target is selected so that the feeders 551b and 551d containing the same type of components as the sole mounted component are attached to a mounting machine 5 other than the particular mounting machine, even when the particular mounting machine has trouble, the sole mounted component can be alternatively mounted because other mounting machine(s) 5 contains the component of the same type, i.e., the sole mounted component or a component capable of replacing the sole mounted component. As described, the component mounting system 1 can have an improved productivity by adjusting the arrangements of the feeders 551. A mounting machine 5 other than the particular mounting machine to which a feeder 551 containing the sole mounted component or a component of the same type is attached may be selected arbitrarily and it is sufficient that the feeder 551 may be attached to at least one mounting machine 5. However, when the component mounting system 1 comprises three or more mounting machines 5, the setup target is preferably selected so that, as shown in FIGS. 5 to 7, the feeders 551 containing the sole mounted component and the like are attached to multiple mounting machines 5.

In the present embodiment, prior to mount the components, not only the standard substrate data but also the alternative substrate data which address the cases when the particular mounting machine has troubles are created and these substrate data are stored. Under a normal run, the components are mounted based on the standard substrate data as described above while upon occurrence of trouble in the particular mounting machine, the standard substrate data is replaced by the alternative substrate data. Therefore, even when the particular mounting machine has trouble, reduction in the overall throughput of the component mounting system 1 can be effectively prevented which is otherwise caused by prolonged stoppage of mounting of the sole mounted component onto the substrates PB.

In the above embodiment, the assumed down time per substrate PB is calculated for each of the mounting machines A to C (step S103), the cycle time of each of the mounting machines A to C is predicted including the assumed down time per substrate PB and the alternative substrate data is created based thereon, thereby the alternative mounting of the components can be appropriately switched. Particularly, by performing the alternative mounting of the components only when the cycle time of the subject mounting machine is the longest (the decision is YES in the step S107), the alternative mounting of the components can be effectively carried out. In the present embodiment, the assumed down time per substrate PB is predicted based on the past failure rate of the head units 560 or feeders 551 to be attached to the mounting machines A to C, namely on the operation history of the mounting machines A to C, and the cycle time of each of the mounting machines A to C is calculated including the assumed down time per substrate PB, thereby allowing appropriate selection of more effective alternative mounting of the components. The operation history of the mounting machines A to C is not limited to the failure rate described above and may be information on the operating time or operation rate. It can also be configured so that an administrator or a user who controls the status of the component mounting system 1 directly enters into the control device 9 (or program creating device 12) the operation history of the mounting machines A to C.

The effect of provision of a feeder containing and retaining the alternative component to a mounting machine other than the particular mounting machine is as follows. Another embodiment of the present invention is described by referring to FIG. 8 hereinbelow.

Figure 8:
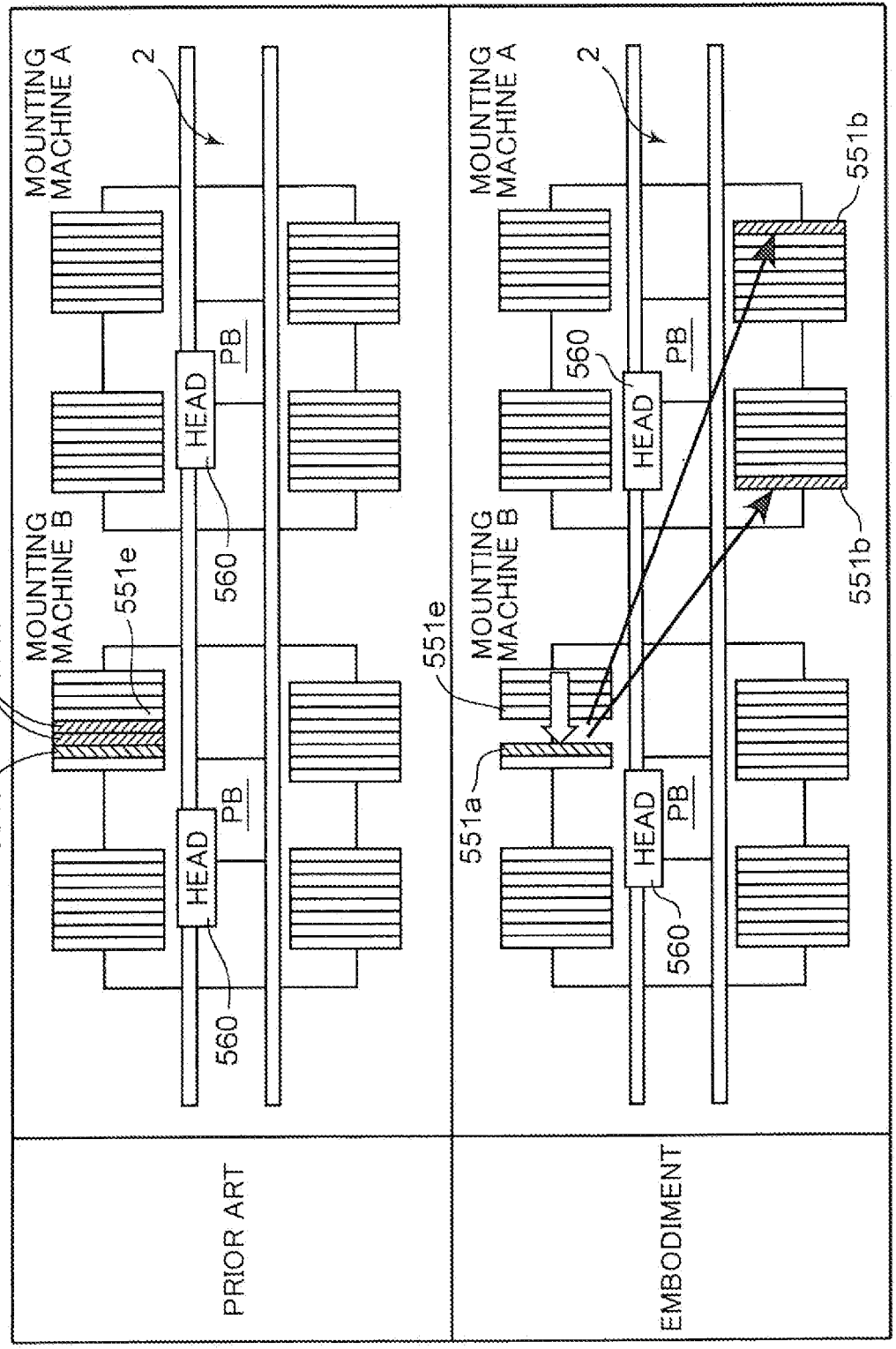
FIG. 8 is a schematic diagram showing another embodiment of the setup method according to the present invention.

FIG. 8 is a diagram showing the effect of another embodiment of the setup method according to the present invention. The upper panel of this figure shows a schematic configuration of a component mounting system according to the prior art and the lower panel shows a schematic configuration of the component mounting system to which the setup method according to the present invention is applied. In these component mounting systems 1, two mounting machines A and B are arranged along a transport path 2 transporting substrates, as shown in this figure, among which the mounting machine A is provided at upstream (right hand side of the figure) and the mounting machine B is provided at downstream (left hand side of the figure) of the substrate transport direction X.

According to the conventional setup method, a substrate data is created which represents which mounting operation is assigned to a mounting machine 5 by using the calculation procedures described in Patent Documents 2 and 3 before creating a setup target based on the substrate data and performing the setup. Because of this, as shown in FIG. 8A, it is an usual practice that not only a feeder 551a containing and retaining the sole mounted component but also a feeder 551b containing and retaining a component which can replace the sole mounted component is preliminarily attached to the same mounting machine, namely the particular mounting machine B which mounts the sole mounted component to the substrate PB. In such a conventional apparatus, the feeder 551b is preliminarily provided to the particular mounting machine B and therefore a head unit 560 in the particular mounting machine B needs to be moved by considering the provision of the feeder 551b. In the layout of the feeders shown in FIG. 8A, a feeder 551e is arranged at a position further from the substrate PB because of the provision of the feeder 551b and this may cause a problem such that the time required for the head unit 560 to reach the feeder 551e is increased and the like.

On the other hand, when the setup method of the present invention is employed, the feeder 551b is provided in a mounting machine A instead of the particular mounting machine B as shown with the solid arrows in FIG. 8B. Thus the position of the feeder 551b is moved from the mounting machine B to the mounting machine A, and the position where the feeder 551b is provided in the conventional apparatus becomes blank. Therefore, as indicated by a white arrow in FIG. 8B, the feeder 551e and feeders adjacent to the feeder 551e on the opposite side relative to the substrate (right hand side of the figure) can be provided closer to the substrate PB, so that the time required for the head unit 560 to reach the feeder 551e and other feeders can be decreased compared to the conventional apparatus. Accordingly, by employing the setup technique of the present invention, the feeder layout can be employed which is advantageous for reduction in talk time.

The present invention is not limited to the above embodiments and can be variously modified to the embodiments other than those described above without departing from the scope of the present invention.

For example, although in the above embodiments, as shown in FIGS. 6 to 8 for example, feeders (alternative component feeding means) 551b and 551d containing and retaining components capable of replacing the sole mounted component are moved from the particular mounting machine to other mounting machines, the feeders 551b and 551d may be removed from the feeder storage 11 and attached to at least one mounting machine other than the particular mounting machine.

Namely, upon update of the setup target based on a newly created or updated alternative substrate data (step S109), if the number of feeders 551a containing and retaining the sole mounted component attached on or allocated to the particular mounting machine is more than necessary, those extra feeders 551a are distributed to at least one mounting machine other than the particular mounting machine as the alternative component feeding means. Even when the particular mounting machine is attached with or allocated with none of the feeders 551a or feeders 551b or 551d that contain and retain a component capable of replacing the sole mounted component, the feeders 551a, feeders 551b and 551d and the like at a required number are allocated to at least one mounting machine other than the particular mounting machine and, upon execution of the setup based on the setup target (step S111), they are extracted from the feeder storage 11 and attached to at least one mounting machine other than the particular mounting machine.

In the above embodiments, a so-called tape feeder 551 containing and retaining components on a tape is employed as the "component feeding means" of the present invention. However, the component feeding means is not limited thereto and the present invention can be applied to the system in which various types of the component feeding means for mounting components, e.g., the ones having a tray form are used.

In the above embodiment, as shown in FIG. 5, the alternative substrate data is created other than the standard substrate data as the "alternative data" of the present invention which have the same composition as the standard substrate data with a partial modification of the content, and the alternative mounting of the components is performed by switching from the standard substrate data to the alternative substrate data. However, it may be configured so that, when the particular mounting machine has trouble, a modified part of the data among the standard substrate data may be stored as the "alternative data" and under occurrence of the trouble, the sole mounted component may be mounted to the substrates PB based on the modified data.

In the above embodiments, the trigger condition for alternative mounting of the alternative component for the sole mounted component to the substrates PB by a mounting machine 5 other than the particular mounting machine is the occurrence of trouble in a mounting machine 5. However, other trigger conditions for alternative mounting may be encompassed, for example, a down time due to trouble exceeding a certain threshold.

In the above embodiments, the present invention is applied to the component mounting system 1 comprising multiple mounting machines 5 which independently mount the components. However, the application of the present invention is not limited thereto. For example, in a component mounting apparatus disclosed in Japanese Patent Application Laid-open No. 2009-188052, multiple mounting units (corresponding to the above component holding member 550, head unit 560, head driving mechanism 570 and the like) are arranged on the base along a transport path. Although it is one apparatus as a whole, each mounting unit can independently mount components on substrates and substantially acts as the "mounting machine" of the present invention. Accordingly, the present invention can also be applied to a component mounting system which comprises such a component mounting apparatus (corresponding to the mounting unit assembly apparatus of the present invention) instead of three mounting machines 5 as described in the above embodiments. The present invention can also be applied to a component mounting system comprising such a component mounting apparatus and the mounting machines 5 of the above embodiments.

The present invention described hereinabove is summarized as follows.

Namely, the setup method according to one aspect of the present invention is a setup method for deciding component feeding means to be attached to each of multiple mounting machines arranged along a transport direction of a substrate in a component mounting system, this method comprising: a first step of deciding component feeding means to be attached to each of the mounting machines based on substrate data preliminarily defining components to be mounted by each of the mounting machines; a second step of determining whether or not there is within the components included in the substrate data a sole mounted component to be mounted by only one mounting machine among the multiple mounting machines; and a third step of deciding, when the determination has been made that the sole mounted component exists in the second step, to attach component feeding means for feeding the sole mounted component or an alternative component capable of replacing the sole mounted component onto at least one mounting machine other than the only one mounting machine.

According to this setup method, at least one mounting machine other than the only one mounting machine is always attached with the component feeding means containing the sole mounted component or an alternative component capable of replacing the sole mounted component. Therefore, even when shortage of the sole mounted components or malfunction occurs in the only one mounting machine, the sole mounted component can be always alternatively mounted by another mounting machine(s), thereby preventing reduction in the overall throughput of the system.

This method may further comprise a fourth step of determining a predicted operation time for each of the mounting machines upon operation of the component mounting system according to the substrate data, and in the third step the decision may be made only when the predicted operation time of the only one mounting machine predicted in the fourth step is longer than the predicted operation time of a mounting machine other than the only one mounting machine.

According to this method, more effective alternative mounting can be performed. In this case, in the fourth step the predicted operation time may be determined based on an operation history of the multiple mounting machines. The predicted operation time may be an operation time per substrate.

In the above method, when the component mounting system comprises three or more mounting machines, it is suitable to be decided in the third step so that the component feeding means feeding the sole mounted component or the alternative component is attached to two or more mounting machines other than the only one mounting machine.

According to this method, even when the only one mounting machine is stopped due to trouble and the like, multiple mounting machines to which the component feeding means containing the sole mounted component or the alternative component can equally mount the component in question, thereby effectively preventing reduction in the throughput.

In the above method, the component mounting system comprises one or more mounting unit assembly apparatus in which multiple mounting units for mounting components on the substrate are arranged in parallel on a common base, and the mounting unit(s) may function as the mounting machines.

On the other hand, the component mounting method according to one aspect of the present invention is a component mounting method by multiple mounting machines arranged along a transport direction of a substrate in a component mounting system, this method comprising: a setup step of deciding component feeding means to be attached to each of the mounting machines based on the setup method according to the above aspect and attaching the component feeding means to each of the mounting machines based on the decision; and a component mounting step of mounting components on the substrate by the respective mounting machines according to the substrate data, wherein in the component mounting step, when an operation time per substrate of the only one mounting machine is longer than an operation time per substrate of a mounting machine other than the only one mounting machine, a sole mounted component or an alternative component is mounted by an alternative mounting machine which is other than the only one mounting machine and to which the component feeding means attaching the sole mounted component or the alternative component is attached, instead of mounting the sole mounted component by the only one mounting machine. More specifically, the setup step comprises an alternative data creation step of creating an alternative data which is obtained by partially modifying the substrate data and which is for mounting the sole mounted component or the alternative component by the alternative mounting machine and in the component mounting step, when the operation time per substrate of the only one mounting machine is longer than an operation time per substrate of a mounting machine other than the only one mounting machine, components are mounted on the substrate by the respective mounting machines according to the alternative data instead of the substrate data.

According to such a component mounting method, when the only one mounting machine has shortage of the sole mounted component or malfunction, the sole mounted component can be alternatively mounted by another mounting machine, thereby preventing reduction in the overall throughput of the system due to occurrence of malfunction in the only one mounting machine.

On the other hand, the component mounting system according to one aspect of the present invention is a component mounting system comprising multiple mounting machines arranged along a transport direction of a substrate, wherein the multiple mounting machines respectively comprise multiple standard component feeding means containing components based on substrate data which preliminarily define components to be mounted by the respective mounting machines and contain a sole mounted component mounted by only one mounting machine among the multiple mounting machines within the components contained in the data, and at least one mounting machine other than the only one mounting machine among the multiple mounting machines comprises alternative component feeding means containing the sole mounted component or an alternative component capable of replacing the sole mounted component. More specifically, the system further comprises a controller which controls the multiple mounting machines and the controller allows extraction of a component from the standard component feeding means according to the substrate data and mounting of the component on the substrate as well as when, during this mounting operation, an operation time per substrate of the only one mounting machine is longer than an operation time per substrate of a mounting machine other than the only one mounting machine, allows the mounting machine provided with the alternative component feeding means to perform mounting of the sole mounted component or the alternative component instead of mounting of the sole mounted component by the only one mounting machine.

According to such a component mounting system, when the only one mounting machine has shortage of the sole mounted component or malfunction, the sole mounted component can be alternatively mounted by another mounting machine, thereby preventing reduction in the overall throughput of the system due to occurrence of malfunction in the only one mounting machine.

INDUSTRIAL APPLICABILITY

As described above, the setup method, component mounting method and component mounting system according to the present invention contribute to improvement in the throughput in the component mounting system in which multiple mounting machines are arranged in parallel along a transport path of substrates and therefore are useful in the field of production of substrates onto which components are mounted.

The invention claimed is:
1. A component mounting method by multiple mounting machines arranged in series along a transport direction of a substrate in a component mounting system,
the method comprising:
a setup step of deciding component feeding apparatuses to be attached to each of the mounting machines based on the decision; and a component mounting step of mounting components on the substrate by the respective mounting machines according to substrate data, wherein in the setup step, executed are:
- a first step of deciding the component feeding apparatuses to be attached to each of the mounting machines based on the substrate data preliminarily defining components to be mounted by each of the mounting machines wherein the substrate data allocates at least one common component to be mounted by each of the mounting machines;
- a second step of determining whether or not there is within the components included in the substrate data a sole mounted component to be mounted by only one mounting machine among the multiple mounting machines;
- a third step of deciding, when the determination has been made that the sole mounted component exists in the second step, to attach the component feeding apparatuses for feeding the sole mounted component or an alternative component capable of replacing the sole mounted component onto at least one mounting machine other than the only one mounting machine; and
- a fourth step of attaching the component feeding apparatuses to each of the mounting machines based on the decisions in the first and third steps, and in the component mounting step, when an operation time per substrate of the only one mounting machine is longer than an operation time per substrate of a mounting machine other than the only one mounting machine, the sole mounted component or the alternative component is mounted by an alternative mounting machine which is other than the only one mounting machine and to which the component feeding apparatuses feeding the sole mounted component or the alternative component is attached, instead of mounting the sole mounted component by the only one mounting machine.

2. The component mounting method according to claim 1, further comprising a fifth step of determining a predicted operation time for each of the mounting machines upon operation of the component mounting system according to the substrate data, wherein in the third step the decision is made only when the predicted operation time of the only one mounting machine predicted in the fifth step is longer than the predicted operation time of a mounting machine other than the only one mounting machine.

3. The component mounting method according to claim 2, wherein in the fifth step the predicted operation time is determined based on an operation history of the multiple mounting machines.

4. The component mounting method according to claim 2, wherein the predicted operation time is an operation time per substrate.

5. The component mounting method according to claim 2, wherein
- the component mounting system comprises three or more mounting machines, and
- in the third step the determination is made so that the component feeding apparatuses feeding the sole mounted component or the alternative component is attached to two or more mounting machines other than the only one mounting machine.

6. The component mounting method according to claim 1, wherein the component mounting system comprises one or more mounting unit assembly apparatus in which multiple mounting units for mounting components on the substrate are arranged in parallel on a common base, and the mounting units function as the mounting machines.

7. The component mounting method according to claim 1, wherein
- the setup step comprises an alternative data creation step of creating an alternative data which is obtained by partially modifying the substrate data and which is for mounting the sole mounted component or the alternative component by the alternative mounting machine, and
- in the component mounting step, when the operation time per substrate of the only one mounting machine is longer than an operation time per substrate of a mounting machine other than the only one mounting machine, components are mounted on the substrate by the respective mounting machines according to the alternative data instead of the substrate data.

* * * * *